United States Patent
Sarpatwari et al.

(10) Patent No.: US 12,176,029 B2
(45) Date of Patent: *Dec. 24, 2024

(54) DRIFT AWARE READ OPERATIONS

(71) Applicant: Micron Technology, Inc., Boise, ID (US)

(72) Inventors: Karthik Sarpatwari, Boise, ID (US); Nevil N. Gajera, Meridian, ID (US); Lingming Yang, Meridian, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 30 days.

This patent is subject to a terminal disclaimer.

(21) Appl. No.: 17/980,382

(22) Filed: Nov. 3, 2022

(65) Prior Publication Data
US 2023/0048450 A1 Feb. 16, 2023

Related U.S. Application Data

(63) Continuation of application No. 17/332,242, filed on May 27, 2021, now Pat. No. 11,527,287.

(51) Int. Cl.
| | | |
|---|---|---|
| *G11C 7/10* | (2006.01) | |
| *G11C 13/00* | (2006.01) | |
| *G11C 16/04* | (2006.01) | |
| *G11C 16/08* | (2006.01) | |
| *G11C 16/10* | (2006.01) | |
| *G11C 16/26* | (2006.01) | |

(52) U.S. Cl.
CPC ........ *G11C 13/004* (2013.01); *G11C 13/0026* (2013.01); *G11C 13/0028* (2013.01); *G11C 13/0069* (2013.01); *G11C 16/08* (2013.01); *G11C 16/10* (2013.01); *G11C 16/26* (2013.01); *G11C 13/0004* (2013.01); *G11C 16/0483* (2013.01)

(58) Field of Classification Search
CPC .............. G11C 13/004; G11C 13/0026; G11C 13/0028; G11C 13/0029; G11C 13/4004; G11C 13/0069; G11C 16/26
USPC ...................................... 365/189.15
See application file for complete search history.

(56) References Cited

U.S. PATENT DOCUMENTS

| | | |
|---|---|---|
| 8,000,141 B1 | 8/2011 | Shalvi et al. |
| 8,169,825 B1 | 5/2012 | Shalvi et al. |
| 10,424,372 B1 * | 9/2019 | Sforzin .............. G11C 13/0061 |
| 10,431,301 B2 | 10/2019 | Mirichigni et al. |
| 10,566,052 B2 | 2/2020 | Mirichigni et al. |
| 11,527,287 B1 | 12/2022 | Sarpatwari et al. |
| 2008/0089135 A1 | 4/2008 | Ito |

(Continued)

*Primary Examiner* — Anthan Tran
(74) *Attorney, Agent, or Firm* — Greenberg Traurig (57) ABSTRACT

Systems, methods and apparatus to read target memory cells having an associated reference memory cell configured to be representative of drift or changes in the threshold voltages of the target memory cells. The reference cell is programmed to a predetermined threshold level when the target cells are programmed to store data. In response to a command to read the target memory cells, estimation of a drift of the threshold voltage of the reference is performed in parallel with applying an initial voltage pulse to read the target cells. Based on a result of the drift estimation, voltage pulses used to read the target cells can be modified and/or added to account for the drift estimated using the reference cell.

20 Claims, 7 Drawing Sheets

(56) References Cited

U.S. PATENT DOCUMENTS

| | | | |
|---|---|---|---|
| 2010/0165719 A1* | 7/2010 | Pellizzer | G11C 13/004 |
| | | | 365/210.1 |
| 2013/0093505 A1* | 4/2013 | Gupta | G05F 1/575 |
| | | | 327/540 |
| 2019/0325953 A1* | 10/2019 | Amato | G11C 11/5628 |
| 2021/0057015 A1 | 2/2021 | Sforzin et al. | |
| 2021/0249073 A1* | 8/2021 | Grobis | H10N 70/8833 |
| 2022/0383950 A1 | 12/2022 | Sarpatwari et al. | |

* cited by examiner

DRIFT AWARE READ OPERATIONS

RELATED APPLICATIONS

The present application is a continuation application of U.S. patent application Ser. No. 17/332,242 filed May 27, 2021, the entire disclosures of which application are hereby incorporated herein by reference.

TECHNICAL FIELD

At least some embodiments disclosed herein relate to memory systems in general and, more particularly but not limited to, techniques of reading memory cells to retrieve data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

A memory device can include a memory integrated circuit having one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include dynamic random-access memory (DRAM) and static random-access memory (SRAM).

Some integrated circuit memory cells are non-volatile and can retain stored data even when not powered. Examples of non-volatile memory include flash memory, read-only memory (ROM), programmable read-only memory (PROM), erasable programmable read-only memory (EPROM) and electronically erasable programmable read-only memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

A non-volatile integrated circuit memory cell can be programmed to store data by applying a voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system configured to estimate a drift in the state of a memory cell in parallel with reading the memory cell. Based on the result of the estimate, further optional operations can be selected and performed to obtain data from the memory cell with improved accuracy.

The memory sub-system can be used as a storage device and/or a memory module. Examples of storage devices, memory modules, and memory devices are described below in conjunction with FIG. 7. A host system can utilize a memory sub-system that includes one or more components, such as memory devices that store data. The host system can provide data to be stored at the memory sub-system and can request data to be retrieved from the memory sub-system.

An integrated circuit memory cell, such as a memory cell in a flash memory or a memory cell in a cross-point memory, can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one); and otherwise, the memory cell is storing a second bit value (e.g., zero).

Optionally, a memory cell can be configured or programmed to store more than one bit of data by being configured or programmed to have a threshold voltage in one of more than two separate voltage regions.

The threshold voltage of a memory cell is such that when the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a single level cell (SLC) mode, or a two-bit data item in a multi-level cell (MLC) mode, or a three-bit data item in a triple level cell (TLC) mode, or a four-bit data item in quad-level cell (QLC) mode, or a five-bit data item in a penta-level cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as error correction code (ECC), low-density parity-check (LDPC) code, etc.

When the data retrieved from the memory cells of the memory sub-system has too many errors for successful decoding, the memory sub-system may retry the execution of the read command, which can cause substantial delay in retrieving the data from the memory cells and degrade the overall read performance of the memory sub-system.

Some techniques have been developed to estimate the drift of the state of a memory cell and use the estimation to calibrate the read voltages used to test and classify the voltage region of the threshold voltage of the memory cell. Using the calibrated read voltages can improve the accuracy in determining the data represented by the threshold voltage of the memory cell. However, the calibration operation can increase latency in read operations (e.g., in cases where the drift is small and thus the calibration is optional).

At least some aspects of the present disclosure address the above and other deficiencies by performing a read operation on a memory cell in parallel with evaluating the drift of the state of the memory cell using a reference cell. The reference cell is configured to have a drift similar to the memory cell. When the drift in the reference cell is small, the drift evaluation has no impact on the reading of the memory cell and thus no impact on the latency of reading the memory cell. When the drift in the reference cell is large, the result of drift evaluation can be used to adjust the read operations performed on the memory cell to account for the drift, as further discussed below.

Figure 1:
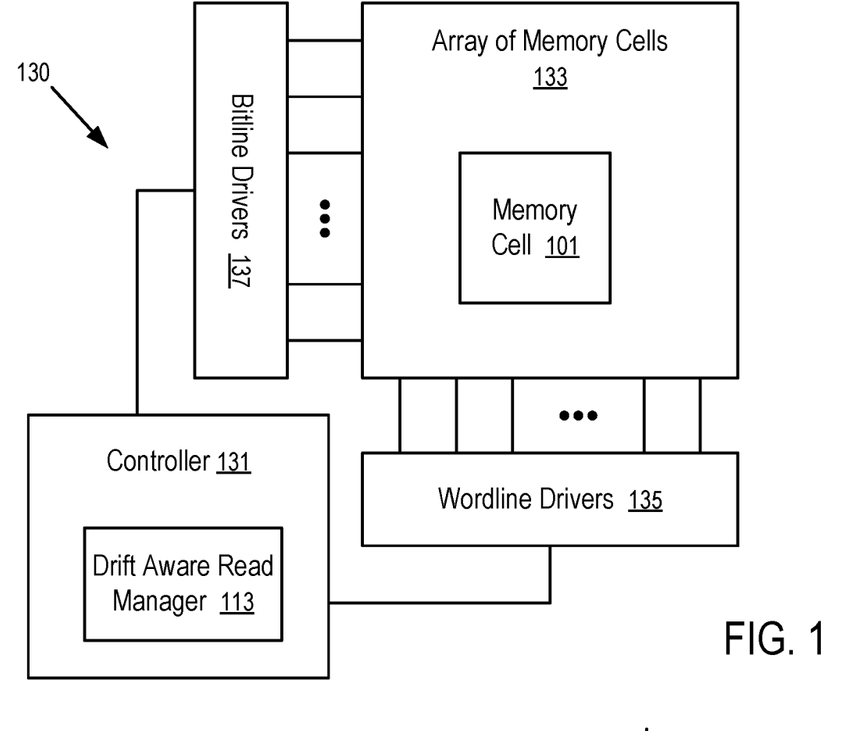
FIG. 1 shows a memory device configured with a read manager according to one embodiment.

FIG. 1 shows a memory device 130 configured with a read manager 113 according to one embodiment.

In FIG. 1, the memory device 130 includes an array 133 of memory cells, such as a memory cell 101. An array 133 can be referred to as a tile; and a memory device (e.g., 130) can have one or more tiles. Different tiles can be operated in parallel in a memory device (e.g., 130).

For example, the memory device 130 illustrated in FIG. 1 can have a cross-point memory having at least the array 133 of memory cells (e.g., 101).

In some implementations, the cross point memory uses a memory cell 101 that has an element (e.g., a sole element) acting both as a selector device and a memory device. For example, the memory cell 101 can use a single piece of alloy with variable threshold capability. The read/write operations of such a memory cell 101 can be based on thresholding the memory cell 101 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 1 includes a controller 131 that operates bitline drivers 137 and wordline drivers 135 to access the individual memory cells (e.g., 101) in the array 133.

Figure 2:
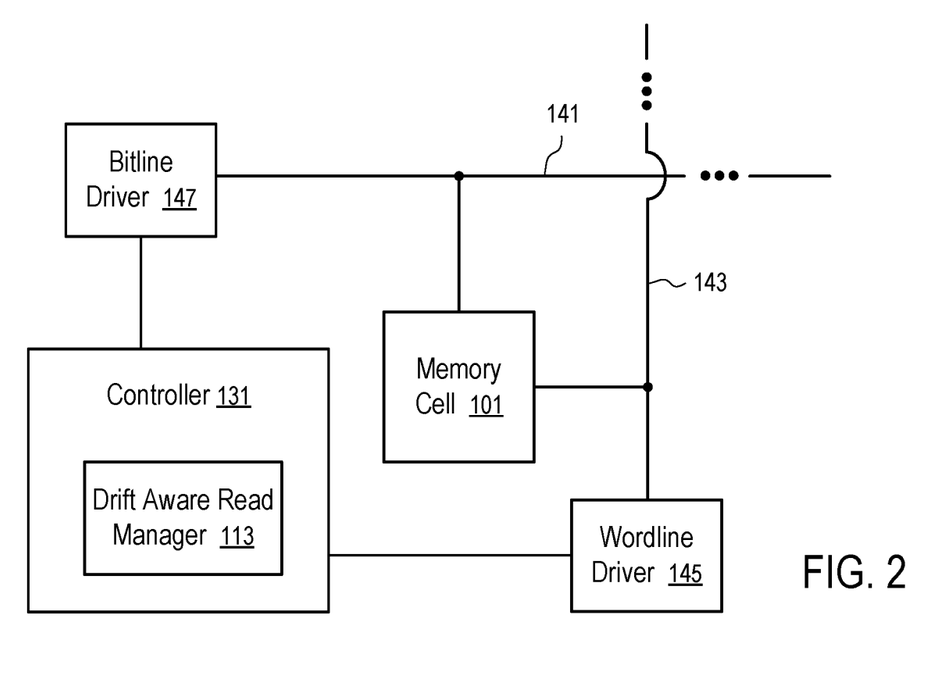
FIG. 2 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 2.

The controller 131 includes a drift aware read manager 113. The read manager 113 can be implemented, for example, via logic circuits and/or microcodes/instructions to estimate a state drift of a set of target memory cells being addressed for data retrieval using a reference cell associated with the set of target memory cells. The drift estimation/evaluation is performed in parallel with reading the set of target memory cells such that when the drift is small, the drift estimation/evaluation has no impact on the latency of reading the target memory cells. If the drift is large, the read manager 113 can immediately initiate operations of a read using a read voltage adjusted according to drift (e.g., before a decoder reports a failure in error recovery).

In one embodiment, a reference cell can also be a typical memory cell 101 in an array 133. Optionally, the target memory cells and the reference cell are configured on separate arrays or tiles. For example, a reference tile or array can be configured to provide multiple reference cells. Each set of target memory cells in a target tile configured to store a codeword, encoded to support error detection and data recovery using an error correction technique, can be assigned a reference cell in the reference tile. When the set of target memory cells is programmed to store the codeword, the reference cell is programmed to a predetermined reference state. A drift of the threshold voltage of the reference cell can be used as an estimate of the drift of the threshold voltages in the target memory cells. Based on a result of detecting/evaluating the drift in the reference cell, the drift aware read manager 113 determines whether to perform further optional read operations using the wordline drivers 135 and the bitline drivers 137.

FIG. 2 shows a memory cell 101 with a bitline driver 147 and a wordline driver 145 configured to apply voltage pulses according to one embodiment. For example, the memory cell 101 can be a typical memory cell 101 in the memory cell array 133 of FIG. 1.

The bitline driver 147 and the wordline driver 145 of FIG. 2 are controlled by the read manager 113 of the controller 131 to selectively apply one or more voltages pulses to the memory cell 101, which can be a typical target memory cell, or a typical reference cell.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

In some implementations, the memory cell 101 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

A self-selecting memory cell 101, having a selector/memory device, can be programmed to have a threshold voltage window. The threshold voltage window can be created by applying programming pulses with opposite polarity to the selector/memory device. For example, the memory cell 101 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 101, the bitline driver 147 and the wordline driver 145 can drive a pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to change the threshold voltage of the memory cell 101 towards a voltage region that represents the data or bit value(s) to be stored in the memory cell 101.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 101 is connected to a bitline driver 147 and a wordline driver 145.

The threshold voltage of a typically memory cell 101 is configured to be sufficiently high such that when only one of its bitline driver 147 and wordline driver 145 drives a voltage in either polarity while the other voltage driver holds the respective line to the ground, the magnitude of the voltage applied across the memory cell 101 is insufficient to cause the memory cell 101 to become conductive. Thus, addressing the memory cell 101 can be performed via both of its bitline driver 147 and wordline driver 145 driving a voltage in opposite polarity relative to the ground for operating/selecting the memory cell 101. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 101) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments.

Figure 3:
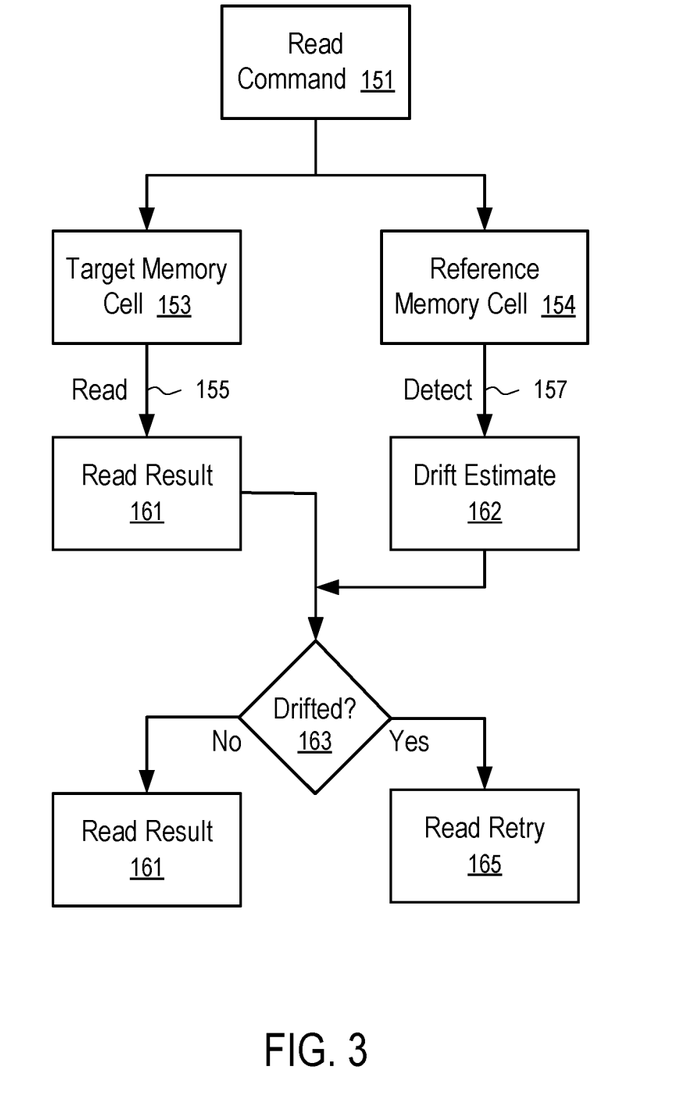
FIG. 3 shows a technique to execute a read command according to one embodiment.

FIG. 3 shows a technique to execute a read command according to one embodiment. For example, the technique of FIG. 3 can be implemented using a read manager 113 illustrated in FIGS. 1 and 2.

In FIG. 3, a read command 151 identifies a target memory cell 153 to retrieve a data item represented by the threshold voltage of the memory cell 153. In response to the read command 151, the read manager 113 identifies a corresponding reference memory cell 154 is pre-associated with the target memory cell 153.

For example, the target memory cell 153 can be one of a set of memory cells having threshold voltages programmed to represent a codeword usable in error detection and recovery. The reference memory cell 154 can be pre-associated with the of memory cells through a predetermined mapping.

In one implementation, the target memory cell 153 and the reference memory cell 154 are configured in separate arrays or tiles to simplify parallel but different operations on the target memory cell 153 and the reference memory cell 154. Alternatively, the target memory cell 153 and the reference memory cell 154 can be configured in a same array 133 or tile, where a pair of voltage drivers connected to the target memory cell 153 and a pair of voltage drivers connected to the reference memory cell 154 are configured differently to implement parallel operations on the target memory cell 153 and the reference memory cell 154.

In response to the read command 151, the read manager 113 performs an operation to read 155 by instructing the voltage drivers of the target memory cell 153 to apply one or more read voltages to the target memory cell 153 in determining the voltage region of the threshold voltage of the target memory cell 153. However, the one or more read voltages are applied in the operation to read 155 without considering a drift of the threshold voltage of the target memory cell 153.

In parallel with the operation to read 155, the read manager 113 performs an operation to detect 157 drift by instructing the voltage drivers of the reference memory cell 154 to apply one or more read voltages to the target memory cell 153 in determining a change in the threshold voltage of the target memory cell 153. The threshold voltage of the reference memory cell 154 has been previously programmed to a predetermined voltage region when the target memory cell 153 is programmed to store data.

When the threshold voltage of the reference memory cell 154 moves outside of the predetermined voltage region, a drift is detected; and it can be inferred that the target memory cell 153 has a similar drift.

The operation to read 155 generates a read result 161 having a data item represented by a voltage region of the threshold voltage of the target memory cell 153 without considering the drift of the threshold voltage of the target memory cell.

The operation to detect 157 generates a drift estimate indicative of a drift in the threshold voltage in the reference memory cell 154 and thus the corresponding drift in the threshold voltage in the target memory cell 153.

If the read manager 113 determines 163 that the drift estimate 162 indicates that the threshold voltage of the target memory cell 153 has not drifted (e.g., remains within a previously known region), the read result 161 can be accepted and provided as, or used to generate, a response to the read command 151.

If the read manager 113 determines 163 that the drift estimate 162 indicates that the threshold voltage of the target memory cell 153 has drifted (e.g., has moved outside of the previously known region), a read retry 165 can be initiated immediately on the target memory cell 153 based on voltage regions adjusted for the drift.

Figure 4:
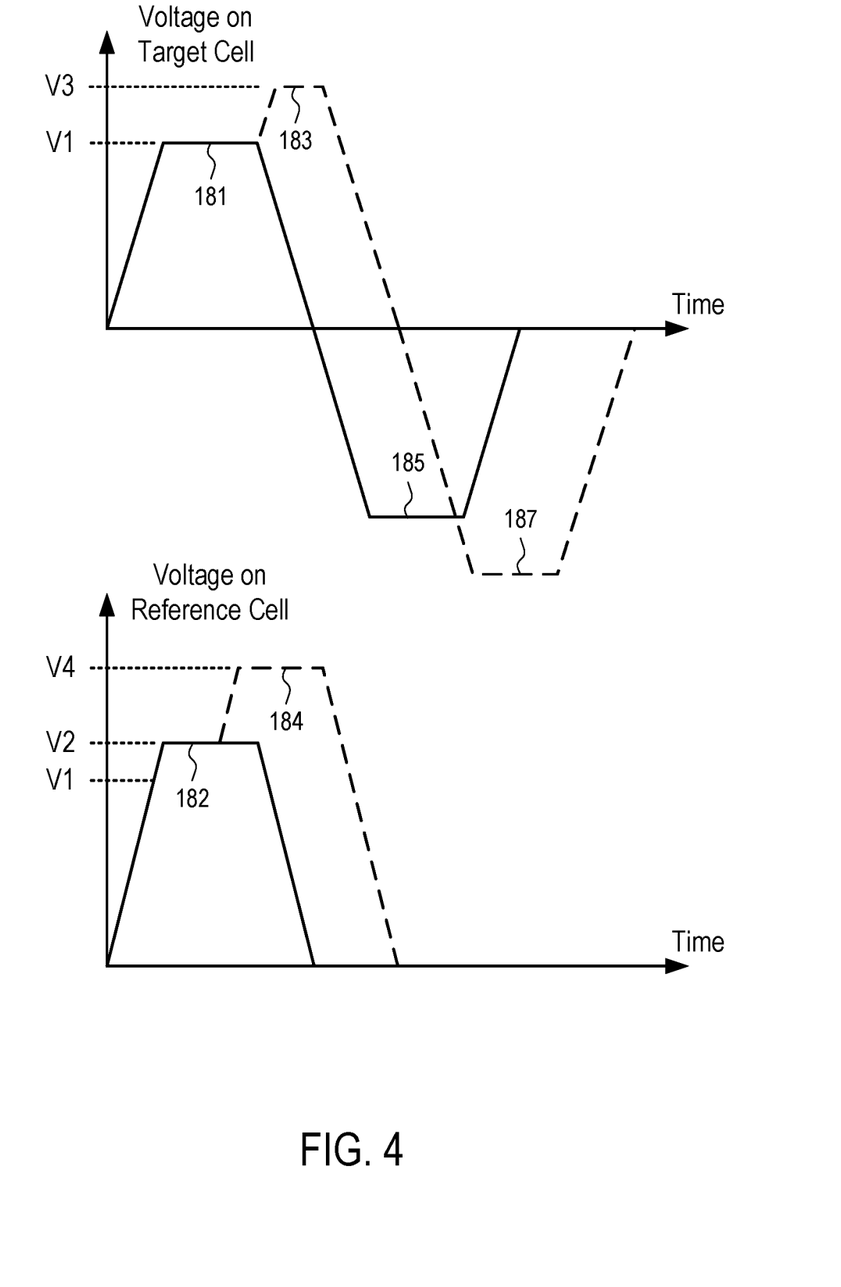
FIGS. 4 and 5 show drift aware read operations according to some embodiment.
Figure 5:
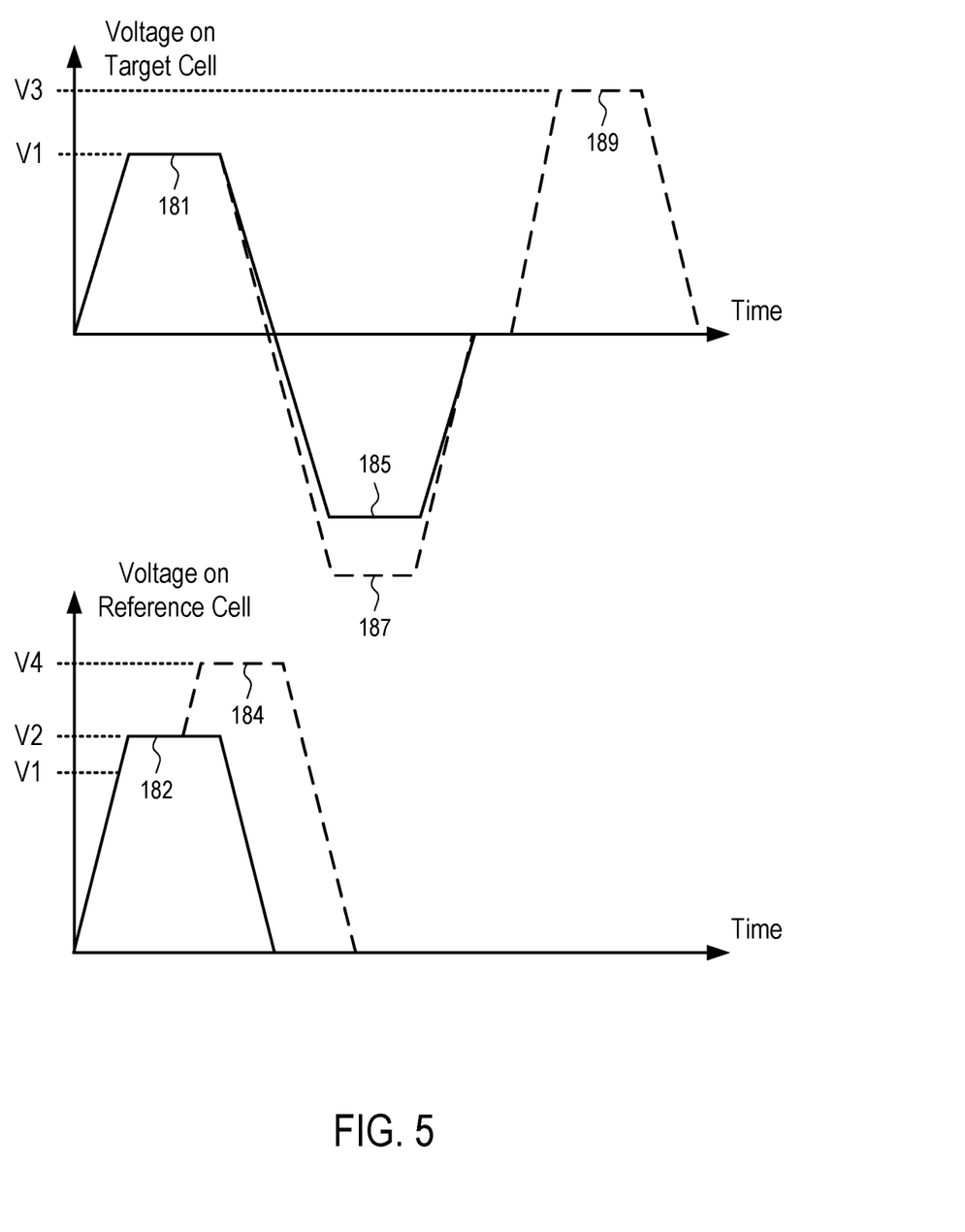

FIGS. 4 and 5 show drift aware read operations according to some embodiment. For example, the technique of FIG. 3 can be implemented using the operations illustrated in FIG. 4 or FIG. 5 and self-selecting memory cells. Voltage pulses can be applied to a self-selecting memory cell 101 using a bitline driver 147 and a wordline driver 145 under the control of a controller 131 having a read manager 113 illustrated in FIGS. 1 and 2; and the self-selecting memory cell 101 can be a target memory cell 153 or a reference memory cell 154.

In FIGS. 4 and 5, the read manager 113 starts to use voltage drivers to apply voltages to the target memory cell 153 and the reference memory cell 154 in parallel, in response to a read command 151.

Before the read command 151, the threshold voltage of the reference memory cell 154 has been previously programmed to a known state represented by a lower voltage region. The threshold voltage of the target memory cell 153 has been previously programmed to a state represented by a voltage region associated with a value written, programmed, or stored into the memory cell 153. For example, the voltage region of the threshold voltage of the target memory cell 153 can be in the lower voltage region to represent a first value (e.g., one), or a higher voltage region to represent a second value (e.g., zero).

After the target memory cell 153 is programmed to store either the first value or the second value, a read voltage V1

181 separates the lower voltage region and the higher voltage region. If the target memory cell 153 becomes conductive when the voltage applied across the target memory cell 153 is driven up to the read voltage V1, the threshold voltage of the target memory cell 153 is lower than V1 and thus in the lower voltage region. As a result, the read manager 113 can conclude that the target memory cell 153 has been stored, programmed, or written into the first value (e.g., one). Otherwise, the target memory cell 153 is determined to have the second value (e.g., zero).

However, the threshold voltage of the target memory cell 153 may be initially programmed to be in the lower voltage region but have drifted to above the read voltage V1. After such a drift, the target memory cell 153 can remain non-conductive after the read voltage V1 is applied; and reading the memory cell using the read voltage V1 can lead to an erroneous result.

In FIGS. 4 and 5, in response to the read command 151, the voltage drivers of the target memory cell 153 and the voltage drivers of the reference memory cell 154 are used in parallel to drive voltages across the target memory cell 153 and the reference memory cell 154 respectively. While the voltage applied across the target memory cell 153 is driven up towards the read voltage V1 181, the voltage applied across the reference memory cell 154 can be driven up towards an alternative read voltage V2 182 to test whether the threshold voltage of the reference memory cell 154 has drifted close towards the alternative read voltage V2.

Since the reference memory cell 154 is known to have been programmed to the lower voltage region, the reference memory cell 154 without a drift can become conductive while the voltage applied across it is driven up towards the read voltage V1. However, if the reference memory cell 154 remains non-conductive while the voltage applied across it reaches the read voltage V1 but becomes conductive when the voltage applied across it is driven up towards the alternative read voltage V2, the threshold voltage of the reference memory cell 154 has drifted to the voltage region between the read voltage V1 and the alternative read voltage V2. If the drift in the reference memory cell 154 is detected, it can be inferred that the target memory cell 153 has a similar drift; and the result of reading the target memory cell 153 using the read voltage V1 181 can be erroneous.

In FIG. 4, in response to the detection of a drift in the reference memory cell 154, the read manager 113 can instruct the voltage drivers of the target memory cell 153 to boost the applied voltage from the read voltage V1 to a higher read voltage V3 183. For example, the higher read voltage V3 can be equal to the alternative read voltage V2, or another voltage determined based on the testing of the threshold voltage of the reference memory cell 154 in detecting the drift.

In FIGS. 4 and 5, if no drift is detected in the reference memory cell 154, the read manager 113 instructs the voltage drivers of the target memory cell 153 to reverse polarity of the applied voltage, and drive the voltage of the opposite polarity to a read voltage 185 (e.g., to read the memory cell from the opposite polarity and/or to apply a read voltage to cancel an impact introduced by the read voltage V1). For example, the read voltages 181 and 185 can have the same magnitude but opposite polarities.

However, if a drift is detected in the reference memory cell 154, the read manager 113 instructs the voltage drivers of the target memory cell 153 to boost the voltage applied across it from V1 to V3 in FIG. 4. If the target memory cell 153 becomes conductive during the voltage being driven toward V3, the read manager 113 concludes that the target memory cell 153 has a threshold voltage in a lower voltage region and thus has the first value (e.g., one); otherwise, the memory cell 153 has the second value (e.g., zero) corresponding to the higher voltage region.

In FIG. 4, after reading the target memory cell 153 by boosting the voltage applied across it to V3, the read manager 113 instructs the voltage drivers of the target memory cell 153 to reverse polarity of the applied voltage, and drive the voltage of the opposite polarity to a read voltage 187 (e.g., to read the memory cell from the opposite polarity and/or to apply a read voltage to cancel an impact introduced by the read voltage V1 181). The read voltage 187 is also adjusted from the corresponding voltage 185 based on the drift detected in the reference memory cell 154. For example, the read voltages 183 and 187 can have the same magnitude but opposite polarities.

In FIG. 4, when no drift is detected in the reference memory cell 154, the drift detection has no impact on the latency in reading the target memory cell 153. When a drift is detected, the latency is increased slightly by the duration of boosting from V1 to V3 and determining whether the target memory cell is conductive or non-conduction under the higher read voltage V3.

In FIG. 5, if a drift is detected in the reference memory cell 154, the read manager 113 instructs the voltage drivers of the target memory cell 153 to use a read voltage 187 having a magnitude larger than the read voltage 185 in the opposite polarity, instead of directly boosting the voltage applied across it from V1 to V3 as illustrated in FIG. 4. The read voltages 181 and 185 can have the same magnitude but opposite polarities.

For example, if the target memory cell 153 is initially programmed to be in the higher voltage region in the positive polarity to be tested via the read voltage V1, the target memory cell 153 has a threshold voltage in a lower voltage region in the negative polarity. When the target memory cell 153 has not drift, the voltage 185 applied in the reverse polarity can be used to determine whether the threshold voltage of the target memory cell 153 in the negative polarity is in a higher voltage region in magnitude, or a lower voltage region in magnitude. If the target memory cell 153 becomes conductive during the voltage being driven toward the read voltage 185, the read manager 113 concludes that the target memory cell 153 has a negative-polarity threshold voltage in a lower voltage region, which corresponds to a positive-polarity threshold voltage in a higher voltage region and thus the second value (e.g., zero). Otherwise, the target memory cell 153 has the first value (e.g., one).

In FIG. 5, after reading the target memory cell 153 in the opposite polarity using a read voltage 187 adjusted from the read voltage 185 according to the detected drift, the manager 113 can further instruct the voltage drivers of the target memory cell 153 to further reverse polarity of the applied voltage, and drive the voltage of the original polarity to a read voltage V3 using an additional voltage pulse 189. As in FIG. 4, the read voltage V3 can be adjusted based on the drift detected in the reference memory cell 154 and have the same magnitude as the read voltage 187 but a polarity opposite to the polarity of the read voltage 187.

Optionally, the additional voltage pulse 189 can be omitted in some instances or some implementations.

In FIG. 5, when no drift is detected in the reference memory cell 154, the drift detection has no impact on the latency in reading the target memory cell 153. When a drift is detected and the result of reading in the opposite polarity using the adjusted read voltage 187 is used, there is no impact on the latency in reading the target memory cell 153. When the result of reading the target memory cell 153 using the additional voltage pulse 189 is used, the latency is increased by the use of the additional voltage pulse 189.

In FIGS. 4 and 5, the adjusted read voltage V3 183 and voltage 187 can be seen as read retry 165 implemented in a way that is integrated into the read operation that is initiated with the assumption of no drift. The tight integration reduces delay caused by read retry 165, since the time period of the read retry 165 overlaps at least in part with the time period of the read without drift. Without the tight integration, the read retry 165 can be initiated after the completion of the use of the read voltage 185 in the reverse polarity.

In FIGS. 4 and 5, after the reference memory cell 154 becomes conductive during drift detection, the read manager 113 can further instruct the voltage drivers of the reference memory cell 154 to apply a voltage pulse 184 to refresh the drift in the reference memory cell 154. When the reference memory cell 154 becomes conductive during drift detection, the voltage and/or current applied to the reference memory cell 154 can alter the drift in the reference memory cell 154. The voltage pulse 184 can be applied to refresh the drift in the reference memory cell 154 so that the drift in the reference memory cell 154 can accurately track the drift in the target memory cell 153.

A set of target memory cells (e.g., 101) in an array 133 can be used to store a codeword having redundant information for error detection and recovery. The set of target memory cells can be connected to a common wordline driver 145 for parallel operation in connection with their respective bitline drivers (e.g., 147), or connected to a common bitline driver 147 for parallel operation in connection with their respective wordline drivers (e.g., 145).

The drifts in the threshold voltages of the set of target memory cells used to store a codeword can be estimated using one or more reference memory cells. The one or more reference memory cells can be in the same array 133 and be connected to the common wordline driver 145 with their bitline drivers (e.g., 147) instructed and/or configured to operate differently from the bitline drivers of the respective target memory cells. Alternatively, when the target memory cells are connected to a common bitline driver 147 for parallel operation, the one or more reference memory cells can also be connected to the common bitline driver 147 with their wordline drivers (e.g., 145) instructed and/or configured to operate differently from the wordline drivers of the respective target memory cells (e.g., to implement the different voltage pulses applied to a target cell and a reference cell, as illustrated in FIG. 4 and FIG. 5).

In general, the different target memory cells can have different drifting rates for their threshold voltages (e.g., due to their different locations in the array 133 and/or their electrical distance to their voltage drivers); and the reference memory cell(s) for the set of target memory cells can be selected to have a drifting rate similar to the fastest drifting target memory cells in the set used to store the codeword.

Alternatively, to avoid different driver configurations within an array, the references memory cell(s) can be in an array separate from the array 133 of the set of target memory cells. Further, the placement and the wiring of the references memory cell(s) for the set of target memory cells can be configured to mimic the drifting behavior of the fastest drifting target memory cells in the set used to store the codeword and thus improve the accuracy in estimating the drift in the target memory cells.

FIGS. 4 and 5 are discussed in connection with self-selecting memory cells programmed to store one bit per memory cell. The techniques can be similarly extended to self-selecting memory cells programmed to store more than one bit per memory cell. In some implementations, more than one reference memory cells can be used to detect different drifts of threshold voltages programmed at different voltage levels/region.

In general, the technique of detecting drift in reference memory cells in parallel with reading target memory cells with the assumption of no drift can be used in other types of memory cells, such as flash memory cells, memory cells using different elements as selector devices and phase-change memory devices. The reading of the target memory cells can be modified in response to drifts being detected in the reference memory cells to minimize delay in read retry.

Figure 6:
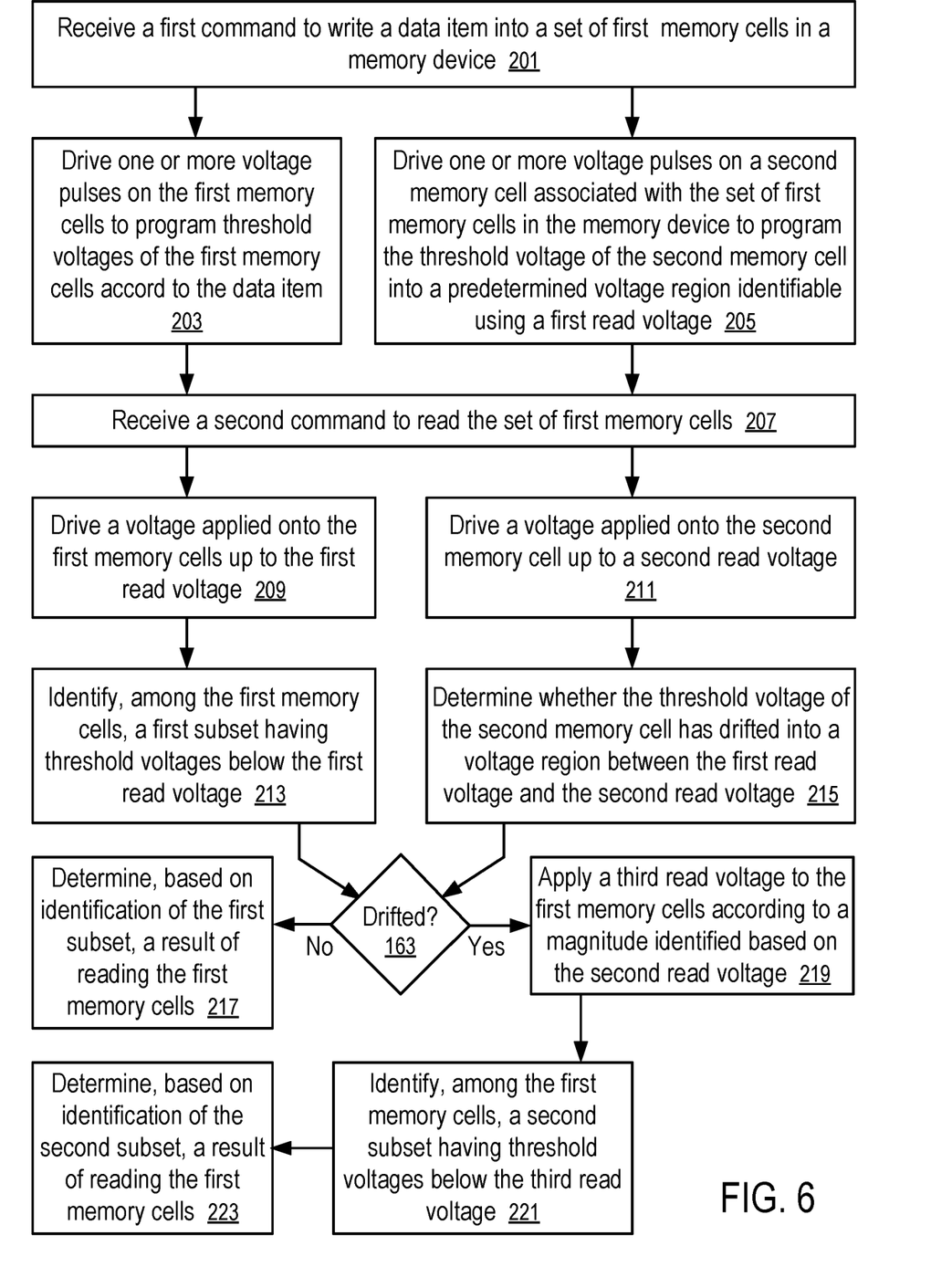
FIG. 6 shows a method to read memory cells according to one embodiment.

FIG. 6 shows a method to read memory cells according to one embodiment. For example, the method of FIG. 6 can be implemented in a memory device 130 of FIG. 1 having a controller 131 with a read manager 113, as illustrated in FIGS. 1 and 2, using the technique of FIG. 3.

At block 201, the controller 131 receives a first command to write a data item (e.g., a codeword) into a set of first memory cells in a memory device 130. In response, the operations at blocks 203 and 205 can be performed in parallel.

At block 203, voltage drivers (e.g., bitline drivers 137 and wordline drivers 135) controlled by the controller 131 drive one or more voltage pulses on the first memory cells to program threshold voltages of the first memory cells accord to the data item.

At block 205, the voltage drivers controlled by the controller 131 drive one or more voltage pulses on a second memory cell associated with the set of first memory cells in the memory device 130 to program the threshold voltage of the second memory cell into a predetermined voltage region identifiable using a first read voltage (e.g., V1).

For example, the first memory cells can include a target memory cell 153; and the second memory cell can be a reference memory cell 154.

For example, the second memory cell can be configured in the memory device 130 to have a threshold drifting rate representative of a fastest drifting memory cell in the set of first memory cells.

For example, the first memory cells can be configured in a first memory cell array; and the second memory cell can be configured in a second memory cell array separate from the first memory cell array. Alternatively, the first memory cells and the second memory cell can be connected, in a same memory cell array 133, to a common bitline driver 147 or a common wordline driver 145.

At block 207, the controller 131 receives a second command to read the set of first memory cells. In response, the operations at blocks 209 and 211 can be performed in parallel; and the operations at blocks 213 and 215 can be performed in parallel.

At block 209, the read manager 113 uses the voltage drivers to drive a voltage applied onto the first memory cells up to the first read voltage (e.g., V1 illustrated in FIGS. 5 and 6).

At block 211, the read manager 113 uses the voltage drivers to drive a voltage applied onto the second memory cell up to a second read voltage (e.g., V2 illustrated in FIGS. 5 and 6).

At block 213, the controller 131 identifies, among the first memory cells, a first subset having threshold voltages below the first read voltage (e.g., V1). The memory cells in the first subset becomes conductive under the first read voltage (e.g., V1).

At block 215, the read manager 113 determines whether the threshold voltage of the second memory cell has drifted into a voltage region between the first read voltage (e.g., V1) and the second read voltage (e.g., V2).

If the read manager 113 determines 163 that the threshold voltage of the second memory cell has drifted into a voltage region between the first read voltage (e.g., V1) and the second read voltage (e.g., V2), the operations at blocks 219 to 223 are performed; otherwise, the operations at block 217 are performed.

At block 217, the controller 131 determines, based on identification of the first subset, a result of reading the first memory cells.

At block 219, the read manager 113 apply a third read voltage to the first memory cells according to a magnitude identified based on the second read voltage (e.g., V2).

At block 221, the read manager 113 identifies, among the first memory cells, a second subset having threshold voltages below the third read voltage.

At block 223, the controller 131 determines, based on identification of the second subset, a result of reading the first memory cells.

For example, the third read voltage can be V3 illustrated in FIG. 4. The read manager 113 can instruct the voltage drivers to boost from the first read voltage V1 up to the third voltage V3 before reducing the voltage applied on the first memory cells and/or before reversing polarity of the voltage applied on the first memory cells. After identifying the second subset, the voltage drivers are instructed to reverse polarity and drive onto the first memory cells a fourth voltage (e.g., read voltage 187 in FIG. 4) having a polarity opposite to a polarity of the third read voltage (e.g., read voltage 183 in FIG. 4). The magnitude of the fourth voltage (e.g., read voltage 183 in FIG. 4) is different from the corresponding read voltage (e.g., 185) to be applied when there is no drift. The magnitude of the fourth voltage (e.g., read voltage 183 in FIG. 4) is based on the second read voltage (e.g., V2) and a determination that the threshold voltage of the second memory cell is between the first read voltage and the second read voltage.

In another example, the third read voltage can be the read voltage 187 illustrated in FIG. 5. In such an implementation, the third read voltage 187 has a polarity opposite from a polarity of the first read voltage 181; and the applying of the third read voltage 187 to the first memory cells includes switching from driving the voltage applied onto the first memory cells in the polarity of the first read voltage 181 to the polarity of the third read voltage 187 at a timing independent of whether the threshold voltage of the second memory cell has drifted to a voltage region between the first read voltage V1 and the second read voltage V2. Thus, before applying the third read voltage 187, the controller is configured to instruct the voltage drivers to perform same operations on the first memory cells independent of whether the drift is detected. The subsequent operations for reading the first memory cells can be modified based on the result of drift estimation. Optionally, after identifying the second subset, a fourth voltage (e.g., V3 in FIG. 5) having a polarity same as the polarity of the first read voltage (e.g., V1 in FIG. 5) is applied to the first memory cells. The magnitude of the fourth voltage can be identified or determined based on the second read voltage (e.g., V2).

As illustrated in FIGS. 4 and 5, if the second memory cell becomes conductive during the operation to detect or estimate the drift, the controller 131 can instruct a bitline driver and a wordline driver of the second memory cell to apply a voltage pulse (e.g., 184) to the second memory cell to refresh the drift so that the drift in the second memory cell remains representative of the drifts in the first memory cells.

Figure 7:
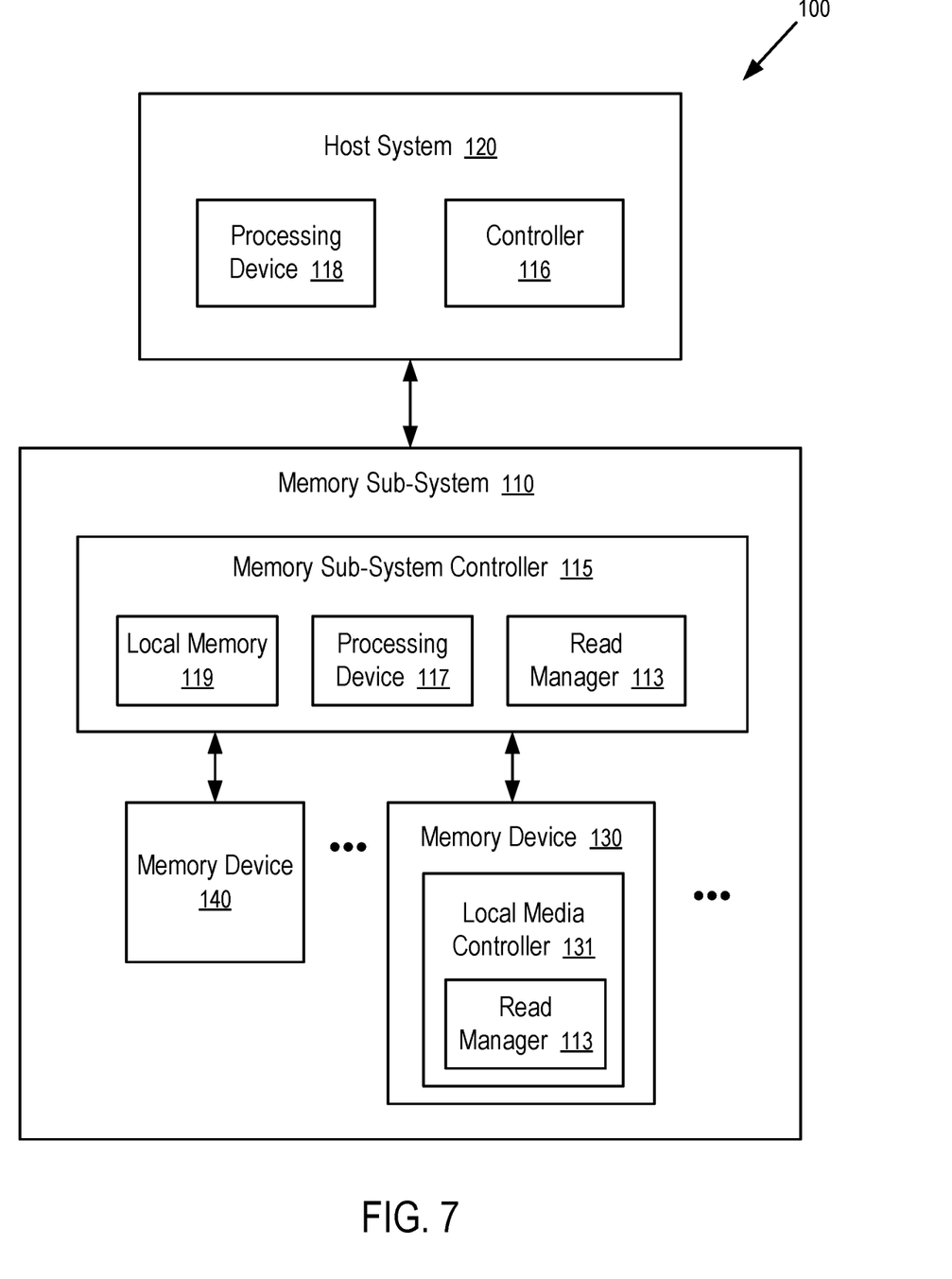
FIG. 7 illustrates an example computing system having a memory sub-system in accordance with some embodiments of the present disclosure.

FIG. 7 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130 of FIG. 1), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an internet of things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 7 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, or any other interface. The physical host interface can be used to transmit data between the host system 120 and the memory sub-system 110. The host system 120 can further utilize an NVM express (NVMe) interface to access components (e.g., memory devices 130 of FIG. 1) when the memory sub-system 110 is coupled with the host system 120 by the PCIe interface. The physical host interface can provide an interface for passing control, address, data, and other signals between the memory subsystem 110 and the host system 120. FIG. 7 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 7 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 131 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 131) for media management within the same memory device package. An example of a managed memory device is a managed NAND (MNAND) device.

The controller 115 and/or a memory device 130 can include a read manager 113, such as the read manager 113 discussed above in connection with FIGS. 1 to 6. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (e.g., processor) of the host system 120, can be configured to execute instructions stored in memory for performing the operations of the read manager 113 described herein. In some embodiments, the read manager 113 is implemented in an integrated circuit chip (e.g., memory device 130) installed in the memory sub-system 110. In other embodiments, the read manager 113 can be part of firmware of the memory sub-system 110, an operating system of the host system 120, a device driver, or an application, or any combination therein.

Figure 8:
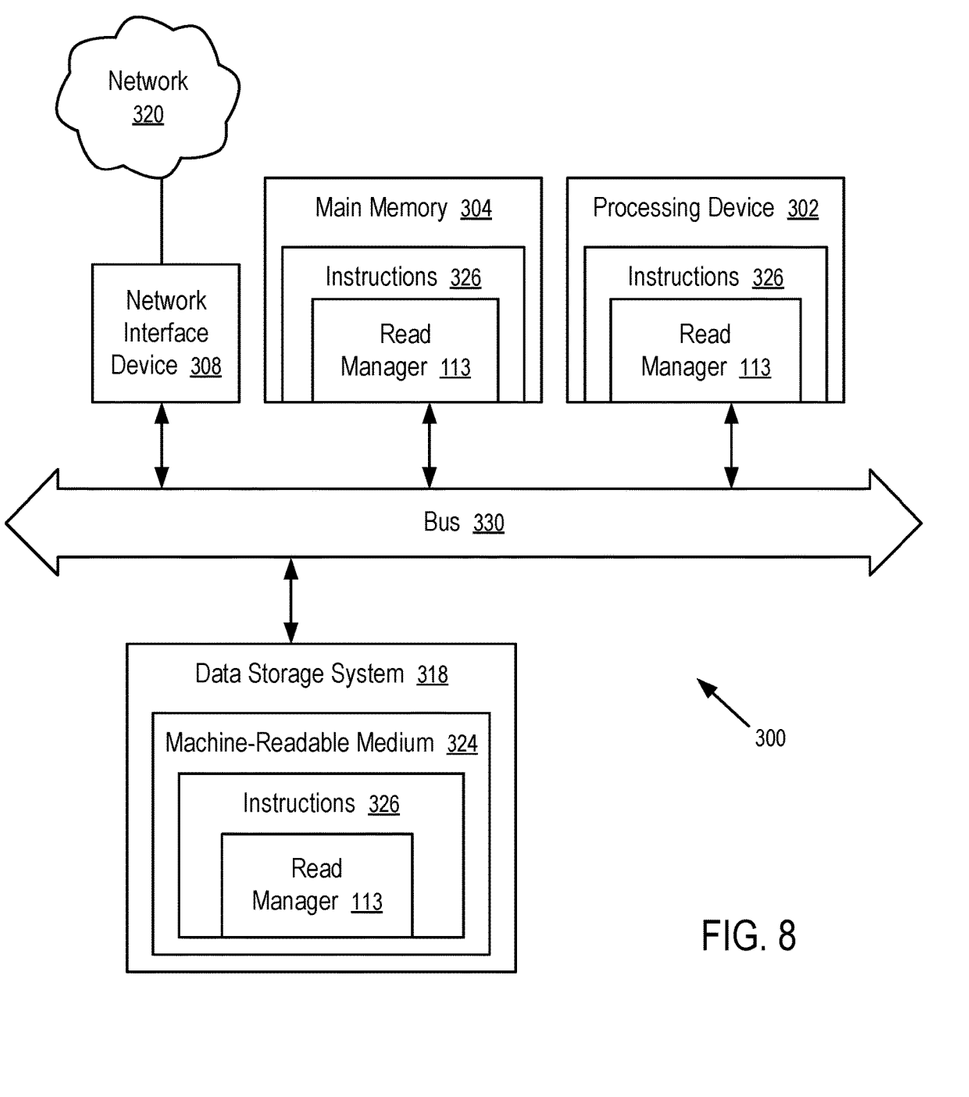
FIG. 8 is a block diagram of an example computer system in which embodiments of the present disclosure can operate.

FIG. 8 illustrates an example machine of a computer system 300 within which a set of instructions, for causing the machine to perform any one or more of the methodologies discussed herein, can be executed. In some embodiments, the computer system 300 can correspond to a host system (e.g., the host system 120 of FIG. 7) that includes, is coupled to, or utilizes a memory sub-system (e.g., the memory sub-system 110 of FIG. 7) or can be used to perform the operations of a read manager 113 (e.g., to execute instructions to perform operations corresponding to the read manager 113 described with reference to FIGS. 1-6). In alternative embodiments, the machine can be connected (e.g., networked) to other machines in a LAN, an intranet, an extranet, and/or the internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 318, which communicate with each other via a bus 330 (which can include multiple buses).

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein. The computer system 300 can further include a network interface device 308 to communicate over the network 320.

The data storage system 318 can include a machine-readable medium 324 (also known as a computer-readable medium) on which is stored one or more sets of instructions 326 or software embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable medium 324, data storage system 318, and/or main memory 304 can correspond to the memory sub-system 110 of FIG. 7.

In one embodiment, the instructions 326 include instructions to implement functionality corresponding to a read manager 113 (e.g., the read manager 113 described with reference to FIGS. 1-6). While the machine-readable medium 324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   first memory cells having first threshold voltages;
   a second memory cell having a second threshold voltage;
   voltage drivers; and
   a circuit configured to:
   estimate a drift of the second threshold voltage of the second memory cell; and
   apply, using the voltage drivers, a voltage based on the drift, in determination of a data item stored in the first memory cells.

2. The device of claim 1, further comprising:
   a controller configured to program, using the voltage drivers and in response to a command to write the data item into the first memory cells, the first threshold voltages of the first memory cells and the second threshold voltage of the second memory cell.

3. The device of claim 1, wherein the circuit is configured to modify operations of using the voltage drivers to read the first memory cells based on the drift.

4. The device of claim 1, wherein the circuit is configured to estimate the drift in parallel with application of a first read voltage to the first memory cells to read the first memory cells.

5. The device of claim 4, wherein the circuit is configured to:
   apply, using the voltage drivers, a second read voltage to the second memory cell in parallel with the first read voltage being applied to the first memory cells; and
   determine whether the second threshold voltage of the second memory cell is in a voltage region between the first read voltage and the second read voltage to estimate the drift.

6. The device of claim 5, wherein the voltage drivers are configured to boost up the second read voltage applied to the second memory cell to a voltage higher than the second read voltage while the second memory cell is in a conductive state, in response to the second threshold voltage of the second memory cell being lower than the second read voltage.

7. The device of claim 6, wherein the voltage drivers are configured to boost up the first read voltage applied on the first memory cells to a third read voltage identified based on the second read voltage, to determine which of the first memory cells has threshold voltages lower than the third read voltage, in response to the second threshold voltage of the second memory cell being between the first read voltage and the second read voltage.

8. The device of claim 7, wherein the third read voltage is in a first polarity; and
the voltage drivers are configured to apply, in response to the second threshold voltage of the second memory cell being between the first read voltage and the second read voltage and after identification of which of the first memory cells has threshold voltages below the third read voltage, a fourth read voltage in a second polarity, opposite to the first polarity, to the first memory cells.

9. The device of claim 6, wherein the first read voltage is in a first polarity; and
the voltage drivers are configured to apply, in response to the second threshold voltage of the second memory cell being between the first read voltage and the second read voltage, a third read voltage in a second polarity, opposite to the first polarity, to the first memory cells, wherein the third read voltage is based on the second read voltage.

10. The device of claim 6, wherein the second memory cell is configured in the device to have a threshold drifting rate representative of a fastest drifting memory cell in the first memory cells.

11. The device of claim 10, wherein the first memory cells are configured in a first memory cell array; and the second memory cell is configured in a second memory cell array separate from the first memory cell array.

12. The device of claim 10, wherein the first memory cells and the second memory cell are connected, in a memory cell array, to a common bitline driver or a common wordline driver.

13. A method, comprising:
programming first threshold voltages of first memory cells of a device;
programming a second threshold voltage of a second memory cell the device;
estimating a drift of the second threshold voltage of the second memory cell; and
applying, using voltage drivers, a voltage based on the drift, in retrieval of the data item from the first memory cells.

14. The method of claim 13, wherein the programming of the second threshold voltage to the predetermined voltage region is in response to a command to write the data item into the first memory cells.

15. The method of claim 14, wherein the estimating of the drift is in parallel with application of a first read voltage to the first memory cells to read the first memory cells.

16. The method of claim 15, further comprising:
applying, using the voltage drivers, a second read voltage to the second memory cell in parallel with the first read voltage being applied to the first memory cells; and
determining whether the second threshold voltage of the second memory cell is in a voltage region between the first read voltage and the second read voltage to estimate the drift.

17. The method of claim 16, further comprising:
boosting up, by the voltage drivers, the second read voltage applied to the second memory cell to a voltage higher than the second read voltage while the second memory cell is in a conductive state, in response to the second threshold voltage of the second memory cell being lower than the second read voltage.

18. The method of claim 17, further comprising:
boosting up, by the voltage drivers, the first read voltage applied on the first memory cells to a third read voltage identified based on the second read voltage, to determine which of the first memory cells has threshold voltages lower than the third read voltage, in response to the second threshold voltage of the second memory cell being between the first read voltage and the second read voltage.

19. An integrated circuit, comprising:
first memory cells having first threshold voltages programmable to represent a data item stored in the first memory cells; and
a second memory cell having a second threshold voltage programmable to a predetermined voltage region; and
a circuit configured to:
estimate a drift of the second threshold voltage of the second memory cell; and
apply a voltage based on the drift, in determination of the data item stored in the first memory cells.

20. The integrated circuit of claim 19, further comprising:
a controller configured to program, in response to a command to write the data item into the first memory cells, the first threshold voltages of the first memory cells and the second threshold voltage of the second memory cell;
wherein the circuit is configured to estimate the drift in parallel with application of a first read voltage to the first memory cells to read the first memory cells.

* * * * *